(12) United States Patent
Song et al.

(10) Patent No.: US 8,039,926 B2
(45) Date of Patent: Oct. 18, 2011

(54) METHOD FOR MANUFACTURING N-TYPE AND P-TYPE CHALCOGENIDE MATERIAL, DOPED HOMOJUNCTION CHALCOGENIDE THIN FILM TRANSISTOR AND METHOD OF FABRICATING THE SAME

(75) Inventors: Kibong Song, Daejeon (KR); Sangsu Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 96 days.

(21) Appl. No.: 12/328,933

(22) Filed: Dec. 5, 2008

(65) Prior Publication Data

US 2009/0146141 A1  Jun. 11, 2009

(30) Foreign Application Priority Data

Dec. 6, 2007  (KR) .................. 10-2007-0126333
Nov. 18, 2008  (KR) .................. 10-2008-0114541

(51) Int. Cl.
*H01L 29/12* (2006.01)
(52) U.S. Cl. ................ 257/616; 257/E29.296
(58) Field of Classification Search .............. 257/42, 257/614, 616, E29.295, E31.029, E29.296
See application file for complete search history.

(56) References Cited

U.S. PATENT DOCUMENTS

| | | | | |
|---|---|---|---|---|
| 3,983,076 A | * | 9/1976 | Rockstad et al. | ......... 252/519.4 |
| 2003/0068862 A1 | | 4/2003 | Li et al. | |
| 2005/0029502 A1 | | 2/2005 | Hudgens | |
| 2006/0049395 A1 | | 3/2006 | Kobayashi | |
| 2007/0096242 A1 | * | 5/2007 | Song et al. | ................. 257/462 |
| 2007/0257256 A1 | * | 11/2007 | Kugler | ........................ 257/40 |
| 2008/0083924 A1 | | 4/2008 | Song et al. | |

FOREIGN PATENT DOCUMENTS

| | | |
|---|---|---|
| EP | 0 093 557 A2 | 9/1983 |
| EP | 93557 A2 * | 11/1983 |
| JP | 59-088869 A | 5/1984 |
| JP | 63-161672 A | 7/1988 |
| KR | 1020070070407 A | 7/2007 |

OTHER PUBLICATIONS

Yin et al. "Electrical Properties of Phase Change and Channel Current Control in Ultrathin Phase-Change Channel Transistor Memory by Annealing." Apr. 25, 2006. Jap J of App Phy, vol. 45, No. 4B, pp. 3238-3242.*

Noboru Yamada, et al; "Rapid-phase transitions of GeTe-Sb$_2$Te$_3$ pseudobinary amorphous thin films for an optical disk memory", Journal of Applied Physics, vol. 69, No. 5, Mar. 1, 1991, pp. 2849-2856.

(Continued)

*Primary Examiner* — Benjamin Sandvik
*Assistant Examiner* — Wensing Kuo
(74) *Attorney, Agent, or Firm* — Ladas & Parry LLP

(57) ABSTRACT

The present invention provides a doped homojunction chalcogenide thin film transistor and a method of fabricating the same, comprising forming an N-type chalcogenide layer constituting a channel layer on a substrate, forming and patterning a diffusion prevention layer on the upper part of the N-type chalcogenide layer, and forming a P-type chalcogenide layer constituting source and drain regions by depositing and diffusing Te alloy on the N-type chalcogenide layer. With the present invention, a thin film transistor can be fabricated using chalcogenide material having N-type conductivity and chalcogenide material having P-type conductivity.

13 Claims, 13 Drawing Sheets

OTHER PUBLICATIONS

Sumio Hosaka, et al; "Proposal for a memory transistor using phase-change and nanosize effects", Microelectronic Engineering, vol. 73-74, 2004, pp. 736-740.

Ki-Bong Song, et al; "Undoped homojunction chalcogen thin-film transistors on glass", Applied Physics Letters, 90, 263510 (2007).
European Search Report: EP 08 17 0842.

* cited by examiner

Oxy-doped
chalcogenide
→ N type
Conductivity

GeTe Diffused
Oxy-chalcogenide
→ P type
Conductivity

Target Area

METHOD FOR MANUFACTURING N-TYPE AND P-TYPE CHALCOGENIDE MATERIAL, DOPED HOMOJUNCTION CHALCOGENIDE THIN FILM TRANSISTOR AND METHOD OF FABRICATING THE SAME

RELATED APPLICATIONS

The present application claims priority to Korean Patent Application Serial Number 10-2007-0126333, filed on Dec. 6, 2007 and Korean Patent Application Serial Number 10-2008-0114541, filed on Nov. 18, 2008, the entirety of which are hereby incorporated by reference.

BACKGROUND OF THE INVENTION

1. Field of the Invention

The present invention relates to a method for manufacturing N-type and P-type chalcogenide materials, a doped homojunction chalcogenide thin film transistor and a method of fabricating the same. More particularly, the present invention relates to a method for manufacturing an N-type chalcogenide material and a P-type chalcogenide material, and a method of fabricating a doped homojunction chalcogenide thin film transistor using the N-type chalcogenide material and P-type chalcogenide material.

This work was supported by the IT R&D program of MIC/IITA [2007-S-032-01, Development for Multiple Platform Supported Mobile Application S/W Development Environment Technology].

2. Description of the Related Art

In general, with the development of information communication technology, technologies such as high-speed processing, large-capacity storage and the like have been developed. As a device used for information storage, for example, there are a photo information storage device known as a CD or a DVD and an electric memory device such as DRAM or the like. As devices used in the information storage and processing, for example, there is a photo thin film transistor or a CMOS image sensor. The photo thin film transistor is commonly fabricated by a CMOS process.

A low-cost low-temperature processed photo conductive thin film transistor (Photo-TFT) having relatively high-efficiency photo conductivity can be fabricated using unique characteristics of elements such as GeTe—$Sb_2Te_3$ ($Ge_2Sb_2Te_5$:GST) including chalcogenide-based elements on a periodic table. Also, an undoped homojunction chalcogenide thin film transistor can be fabricated using a diode function expected from a principle to form a potential barrier generated from differences between charge concentration by a lone pair electron state of amorphous germanium antimony telluride ($Ge_2Sb_2Te_5$) including the chalcogenide-based elements and charge concentration by a vacancy state of the same material $Ge_2Sb_2Te_5$.

However, a method for manufacturing N-type and P-type chalcogenide materials by adding oxygen $O_2$ including chalcogenide based elements based on the periodic table and a method of fabricating a thin type transistor using the manufactured N-type and P-type chalcogenide material, as described in the present invention, have not been publicly known.

The prior arts related to an optical recording material of optical information storage and a next generation non-volatile memory, which has been studied using $Ge_2Sb_2Te_5$, will be described.

[Prior Art 1]

Prior art 1, which has features that if predetermined light is applied to $Ge_2Sb_2Te_5$, its phase is changed from amorphous to crystalline or from crystalline to amorphous, determines on whether or not $Ge_2Sb_2Te_5$ can be applied to optical information storage using an optically configured optical pick-up, if the result of the phase change is used.

[Prior Art 2]

Prior art 2, which has been proposed by Ovsinsky, the first proposer of a $Ge_2Sb_2Te_5$ based phase change material, relates to a non-volatile memory PRAM using a phase change, that is, a method of applying a phase change phenomenon to an electric memory. This technique relates to a method of applying a switching phenomenon shown by mutually moving crystalline phases to the electric memory.

[Prior Art 3]

Prior art 3 relates to a thesis of an electric memory transistor that is fabricated using $Ge_2Sb_2Te_5$ and the results of measured characteristics of the electric memory transistor is published. The prior art 3 basically corresponds to a method using a phase change mechanism obtained in the prior art 1 and the prior art 2, and relates to a method to apply the switching phenomenon which shows the states of mutually moving phases to the crystalline phase or the amorphous phase to a memory and a TFT.

A chalcogenide material has been known as a material having typical P-type conductivity due to unique characteristics of its atomic structure. The main factor to show the P-type conductivity has been known to be generated by a vacancy state within a band gap and owing to the unique characteristics of such an atomic structure, an N-type chalcogenide material has not been developed up to now.

FIG. 1 is a concept view of a structure of a photo thin film transistor fabricated using a general CMOS process. A structure of a photo thin film transistor actually fabricated through a CMOS process is more complicated.

Referring to FIG. 1, an amorphous silicon film 110 is formed on a silicon substrate 100 doped with impurity. Source and drain ohmic contact parts 120 for improving ohmic contacts are formed at both sides of the amorphous silicon film 110. The ohmic contact parts 120 are formed by ion-implanting the impurity into portions of the amorphous silicon film 110. A source electrode 140 and a drain electrode 150 are formed on the source and drain ohmic contact parts 120, respectively. A gate insulating film 130 is formed on the amorphous silicon film 110, the ohmic contact parts 120, and the source and drain electrodes 150. The gate insulating film 130 is formed using an oxide film. A gate electrode is formed on the gate insulating film 130 using a metal film 160.

In order to fabricate the conventional photo thin film transistor having the structure, a high temperature (for example, 500° C. to 1000° C.) process is required. In particular, the thin film transistor fabricated using the CMOS process of FIG. 1 uses a high-cost silicon substrate and requires the ion-implantation process for forming the ohmic contact parts. The thin film transistor must also need the hydrogenated and doped ohmic contact parts.

Most of TFTs currently used in a TFT-LCD display and/or a mobile phone or the like have the structure of FIG. 1.

In the case of the chalcogenide material, in order to utilize a layer having reference numeral 110 of FIG. 1 as a channel layer, a channel layer of the TFT should be first an N-type material or a P-type material, and in contrast, the ohmic contact parts having reference numeral 120 should be the P-type material or the N-type material. Such a structure has been known as the typical structure of the best transistor.

SUMMARY OF THE INVENTION

The present invention is contrived to solve the above problems.

It is an object of the present invention to develop a chalcogenide material having N-type conductivity and a chalcogenide material having P-type conductivity using a chalcogenide material that is actively used or can be used as a next-generation device in the field of information storage.

Also, it is another object of the present invention to fabricate a high-efficiency doped homojunction chalcogenide thin film transistor having a high on/off proportion using the developed material of the N-type conductivity and the developed material having the P-type conductivity.

A method for manufacturing an N-type chalcogenide material according to the present invention comprises: disposing a chalcogenide material as a target; and injecting argon (Ar) gas and oxygen ($O_2$) gas into a deposition chamber in order to deposit the chalcogenide material on a substrate.

In particular, the chalcogenide material is $Ge_2Sb_2Te_5$.

Meanwhile, a method for manufacturing a P-type chalcogenide material according to the present invention comprises: depositing Te alloy on an N-type chalcogenide material; and diffusing the N-type chalcogenide material on which the Te alloy is deposited.

In particular, the Te alloy is one selected from the group consisting of GeTe, SbTe and Te.

Also, the diffusing the N-type chalcogenide material on which the Te alloy is deposited comprises applying heat energy to the N-type chalcogenide material on which the Te alloy is deposited.

Meanwhile, a method of fabricating a chalcogenide thin film transistor comprises: forming an N-type chalcogenide layer constituting a channel layer on a substrate; forming and patterning a diffusion prevention layer on the upper part of the N-type chalcogenide layer; and forming a P-type chalcogenide layer constituting source and drain regions by depositing and diffusing Te alloy on the N-type chalcogenide layer.

In particular, the substrate is any one of a glass substrate, a plastic substrate, a polyimide substrate and a vinyl substrate.

Also, the chalcogenide layer is forming a $Ge_2Sb_2Te_5$ layer.

The method of fabricating the chalcogenide thin film transistor further comprises forming a gate electrode by interposing a gate dielectric at the bottom of the N-type chalcogenide layer constituting the channel layer.

Also, the gate dielectric is a polymer PMMA film that is organic material.

Also, the gate dielectric is a silicon oxide film formed using a PECVD method.

Meanwhile, a thin film transistor according to the present invention comprises: a chalcogenide layer forming a channel layer and constituting a first type conductivity; a chalcogenide layer formed on both sides of the chalcogenide layer having the first type conductivity to constitute source and drain regions and having a second type conductivity; and source and drain electrodes connected to the chalcogenide layer constituting the source and drain regions and having the second conductivity.

In particular, the chalcogenide layer constituting the channel layer and the source and drain regions is a $Ge_2Sb_2Te_5$ layer.

Also, the thin film transistor further comprises a gate electrode formed by interposing a gate dielectric at the bottom of the chalcogenide layer having the first conductivity.

Also, the gate dielectric is a polymer PMMA film that is an organic material.

Also, the gate dielectric is a silicon oxide film formed by a PECVD method.

Also, a diffusion prevention layer is formed on the upper part of the chalcogenide layer having the first conductivity.

Also, the channel layer is N-type, and the source and drain regions are P-type.

Also, the channel layer is P-type, and the source and drain regions are N-type.

According to the present invention, the following acting effects can be obtained:

A thin film transistor can be fabricated by a method for manufacturing chalcogenide material having N-type conductivity and chalcogenide material having P-type conductivity using chalcogenide material, and the manufactured chalcogenide material having N-type conductivity and chalcogenide material having P-type conductivity.

Also, the thin film transistor according to the present invention can be operated on a plastic substrate as well as can be fabricated using a low-temperature process, without ion-implantation, having an advantage that it can be implemented at low cost.

Also, the thin film transistor according to the present invention has a great mobility, such that it is expected to be able to be fabricated as a sensor or a logic device on a plastic substrate.

DESCRIPTION OF THE PREFERRED EMBODIMENTS

Figure 1:
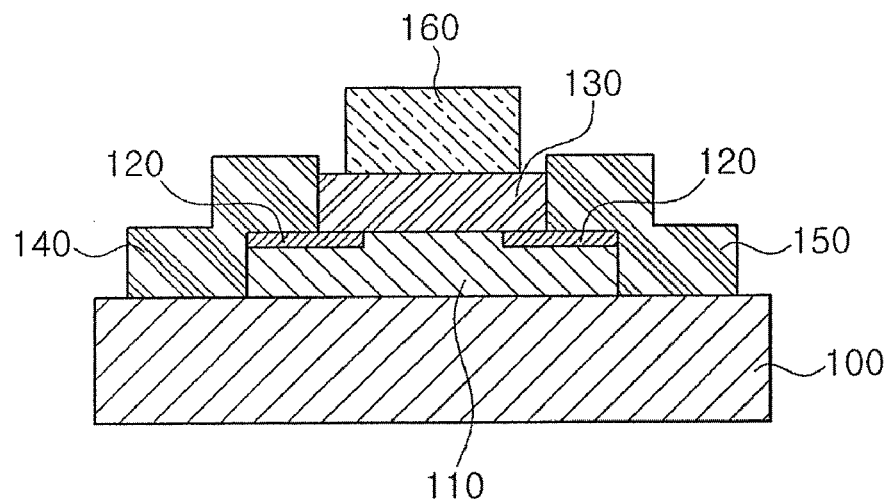
FIG. 1 is a conceptual view of a structure of photo thin film transistor fabricated using a general CMOS process.

Hereinafter, the preferred embodiments of the present invention will be described in detail with reference to the accompanying drawings. Herein, the repeated explanation and the detailed description on the well-known function and constitution which may make the gist of the present invention obscure will be omitted. The embodiments of the present invention will be provided in order to clearly describe the present invention to those skilled in the art. Therefore, the shape, size or the like of elements in the drawings may be exaggerated for more definite description. In the drawings, the size and thickness of films (layers) or regions are exaggerated for clarity of the specification.

The present invention uses a chalcogenide layer, which is actively used or can be used as a material for a next generation non-volatile memory device in the field of information storage. As an example of the chalcogenide layer, a GeTe—$Sb_2Te_3$ layer ($Ge_2Sb_2Te_3$, hereinafter, referred to as 'a GST layer') is used. Although the GST layer is exemplified as the chalcogenide layer, the present invention is not limited thereto.

The chalcogenide layer used in the present invention has high efficiency photo conductivity, such that it may be used as a photo conductive layer of a photo thin film transistor (Photo TFT). Furthermore, in the chalcogenide layer of the present invention, a phase change can be made from amorphous to crystalline or crystalline to amorphous by means of light or heat energy.

The thin film transistor of the present invention can also be formed on a glass substrate using a low-cost and low-temperature process.

Due to the unique characteristics of an atomic structure, the chalcogenide layer can be formed of only P-type semiconductor. A plurality of P-type charges depend on the state of a lone pair electrons in an amorphous phase. The Fermi level (Ef) of the amorphous chalcogenide layer has a P-type semiconductor shape close to an intrinsic level (Ei), and a difference in charge concentration (a difference in carrier concentration) between the intrinsic level (Ei) and the Fermi level (Ef) has a small value, i.e., φp2. A band gap (Egp2) between a valence band (Ev) and a conduction band (Ec) of the amorphous chalcogenide layer is 0.7 eV. And, in the case of the crystalline chalcogenide, the lone pair electron state in the amorphous state is disappeared and as a result, the characteristics of the P-type semiconductor are occur by the plurality of charges generated by a vacancy state generated from an atomic structure having the periodical crystalline phase.

Therefore, due to the defect of the basic atomic structure described above, as the chaocogenide material, the N-type chalcogenide material has not been developed using a doping method.

The present invention proposes a method capable of developing a chalcogenide material (hereinafter, referred to as 'N-type chalcogenide material) which shows the N-type semiconductor characteristics by injecting oxygen into the chalcogenide material having such a defect, that is, showing the P-type semiconductor characteristics.

First, a chalcogenide material (for example, GST) is deposited on a substrate. A device used in depositing the chalcogenide material is a sputter device (for example, an RF magnetron sputter), which is typically used in depositing the chalcogenide material. A heat deposition apparatus other than the sputter may also be used.

A condition to deposit the GST that is the chalcogenide material as a co-sputter or a single target, using the sputter, is searched. At this time, argon (Ar) gas is used as plasma gas. The above-described process is a method generally used in depositing the chalcogenide material.

Figure 2:
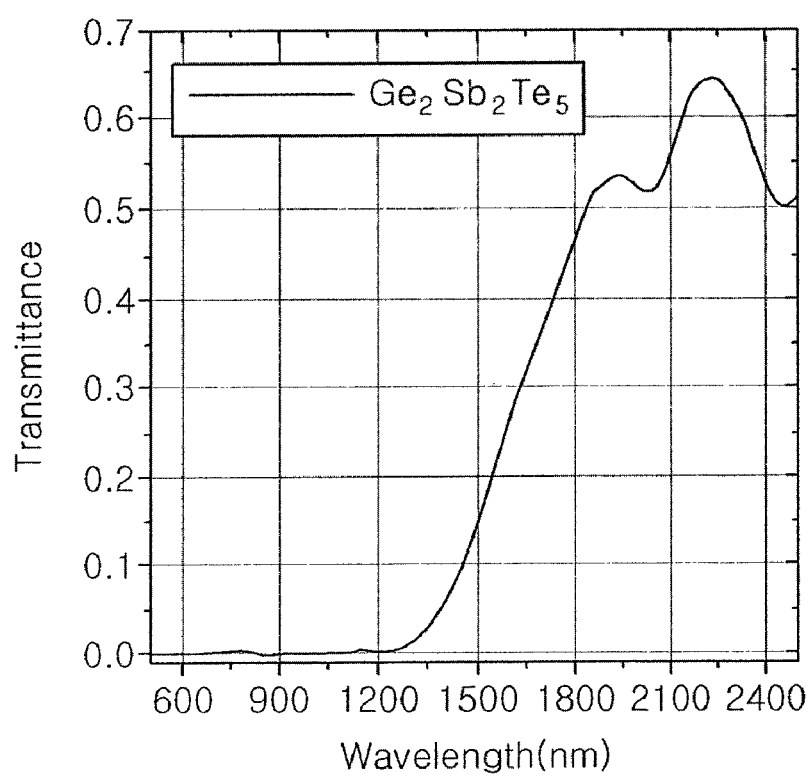
FIG. 2 is a diagram showing light transmittance curve of amorphous chalcogenide deposited through a general process, the light transmittance curves of an amorphous chalcogenide thin film being deposited through a general sputtering method.

FIG. 2 is a graph showing transmittance characteristics of the chalcogenide material generally deposited according to the above-described method.

In the case of amorphous chalcogenide, a band gap is 0.7 eV (a wavelength band of about 1700 nm) as shown in FIG. 2. If the amorphous chalcogenide deposited as above is crystallized, the band gap becomes about 0.5 eV, such that a light transmittance curve becomes a curve having a long wavelength.

Hereinafter, a method for manufacturing the N-type chalcogenide material will be described.

Figure 3:
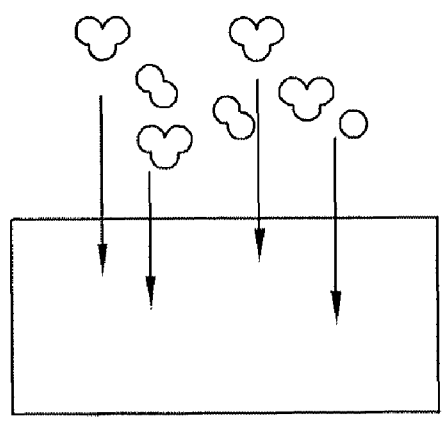
FIG. 3 is a diagram illustrating a method for manufacturing an N-type chalcogenide material and a P-type chalcogenide material and illustrates a method for manufacturing the N-type chalcogenide material and the P-type chalcogenide material formed through oxygen injection and GeTe diffusion.
Figure 3:
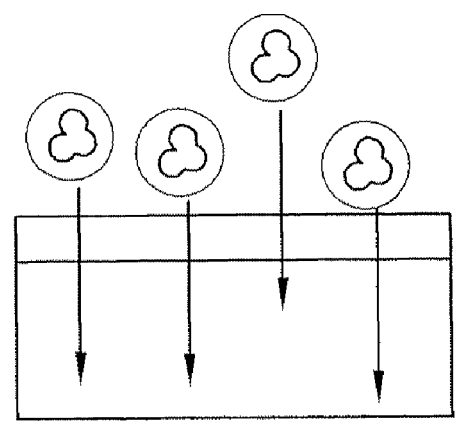

First, in order to manufacture the N-type chalcogenide material, oxygen is added to a deposition chamber when the amorphous chalcogenide is manufactured, as shown in FIG. 3.

More specifically, the chalcogenide material is disposed as the target layer. And, oxygen gas in addition to the argon gas is simultaneously injected into the deposition chamber. Then, some of the injected oxygen gas is injected into a chalcogenide thin film to be deposited, and the N-type chalcogenide material is formed by the injected oxygen. In other words, if the injection of the argon gas and the oxygen gas is completed, high frequency energy is supplied to a sputter gun (not shown) so that a mixture of the argon gas and oxygen gas is ionized, thereby generating plasma.

Ions of the ionized argon and oxygen gas collide with a target to sputter the target material in the generated plasma, such that chalcogenide material is deposited on the substrate.

When depositing the chalcogenide material using the sputter and injecting the argon gas for forming the plasma, the oxygen gas as well as the argon gas are simultaneously injected and deposited in order to deposit the N-type chalcognide material. The N-type chalcognide material can be deposited according to a change in proportion of the amount of argon gas and oxygen gas injected at this time.

The oxygen gas and argon gas are injected into the sputter, having the proportions of the amount of oxygen gas/argon gas used in the present invention, such as 0.1, 0.25, 0.35 and 0.5, respectively (for example, the amount of injected oxygen 2 sccm/the amount of injected argon 20 sccm=0.1). At this time, the thickness of the deposited N-type chalcogenide material is controlled by a deposition time.

It can be appreciated that the oxy-doped and deposited chalcogenide material is amorphous through an X-ray diffraction (SRD) measurement.

Figure 4:
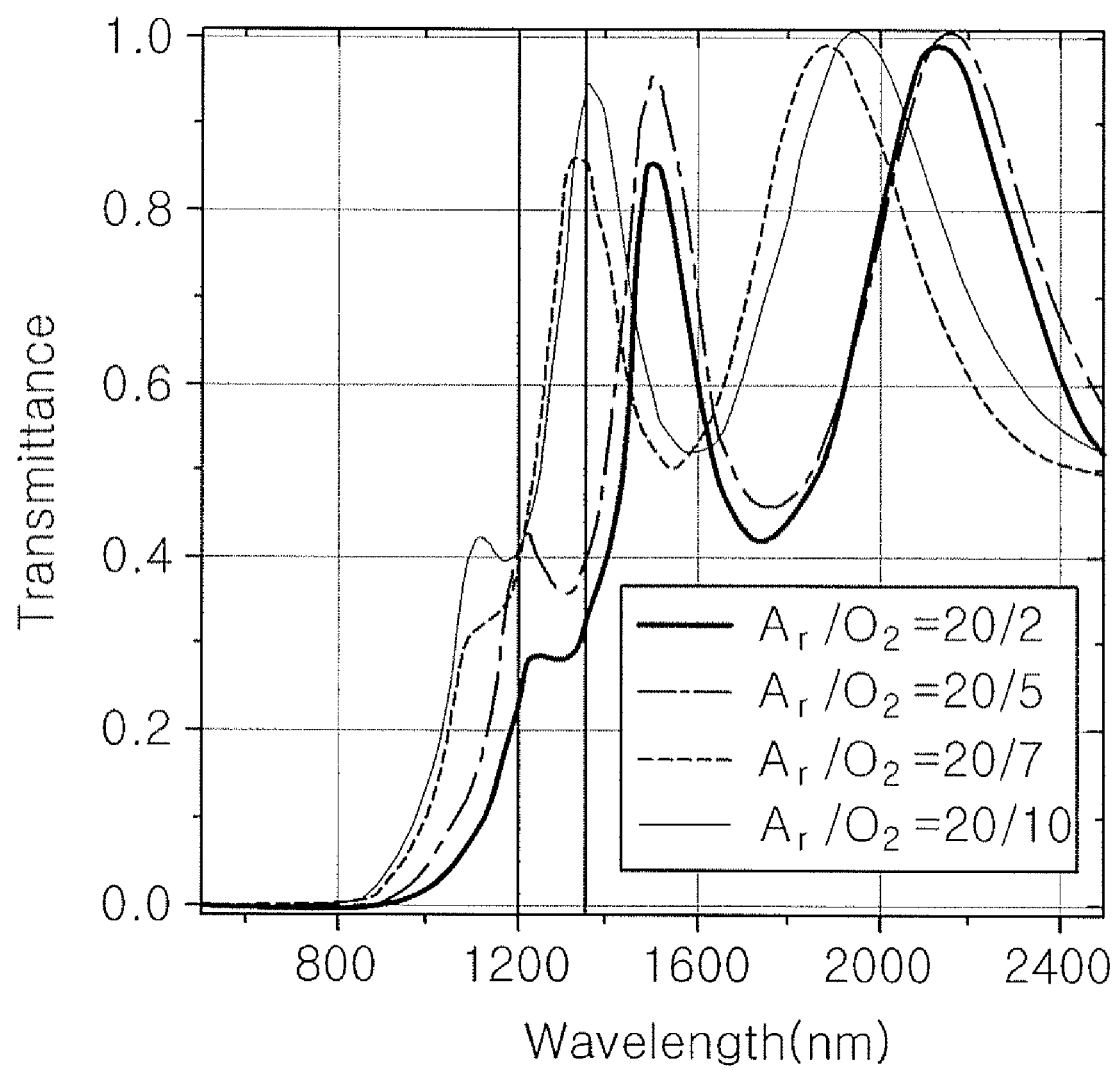
FIG. 4 is a diagram illustrating light transmittance curves of chalcogenide material varying according to the amount of injected oxygen.

FIG. 4 shows results of measuring light transmittance curves of chalcogenide material varying when the oxygen gas and the argon gas are injected to the sputter, in the proportions of the amount of oxygen gas/argon gas used in the present invention, such as 0.1, 0.25, 0.35 and 0.5, respectively. It can be appreciated that as the amount of injected oxygen increases, the band gap moves to have a short wavelength. It can be appreciated that when the proportions of the amount of injected oxygen gas/argon gas are 0.1, 0.25, 0.35 and 0.5, respectively, the band gap energy moves to have about 1300 nm, 1200 nm, 1100 nm, and 1000 nm band of wavelength, respectively.

The reason why the bending is generated from the long wavelength (after 1400 nm) of the light transmittance curve in FIG. 4 is a typical phenomenon generated due to light interference, and thus does not have an important meaning in expecting the band gap.

In order to appreciate whether the conductivity of the chalcogenide material manufactured using different injection proportions of the amount of oxygen gas/argon gas is N-type or P-type, a hall effect of each material is measured.

Table 1 shows a result of measuring the hall effects of the chalcogenide material manufactured using different injection proportions of the amount of oxygen gas/argon gas. Through the hall effect, the type the concentration, the mobility and the like of a plurality of carriers can be appreciated.

TABLE 1

| Injection proportion of the amount of oxygen gas/argon gas | Carrier concentration (/cm$^2$) |
|---|---|
| 0.1 | −1.2e15 |
| 0.25 | −6.99e14 |
| 0.35 | −5.5e14 |

Referring to Table 1, it can be appreciated that the N-type chalcogenide material is formed regardless of the amount of injected oxygen, when the injection proportion of the amount of oxygen gas/argon gas is from 0.1 to 0.35.

Although the N-type chalcogenide material is expected to be formed even when the injection proportion of the amount of oxygen gas/argon gas is after 0.35, if there are too much oxygen, the chalcogenide material becomes an oxide to be amorphous, such that it cannot be appreciated which conductivity (for example, N-type or P-type) the chalcogenide material has through the hall effect.

Figure 5:
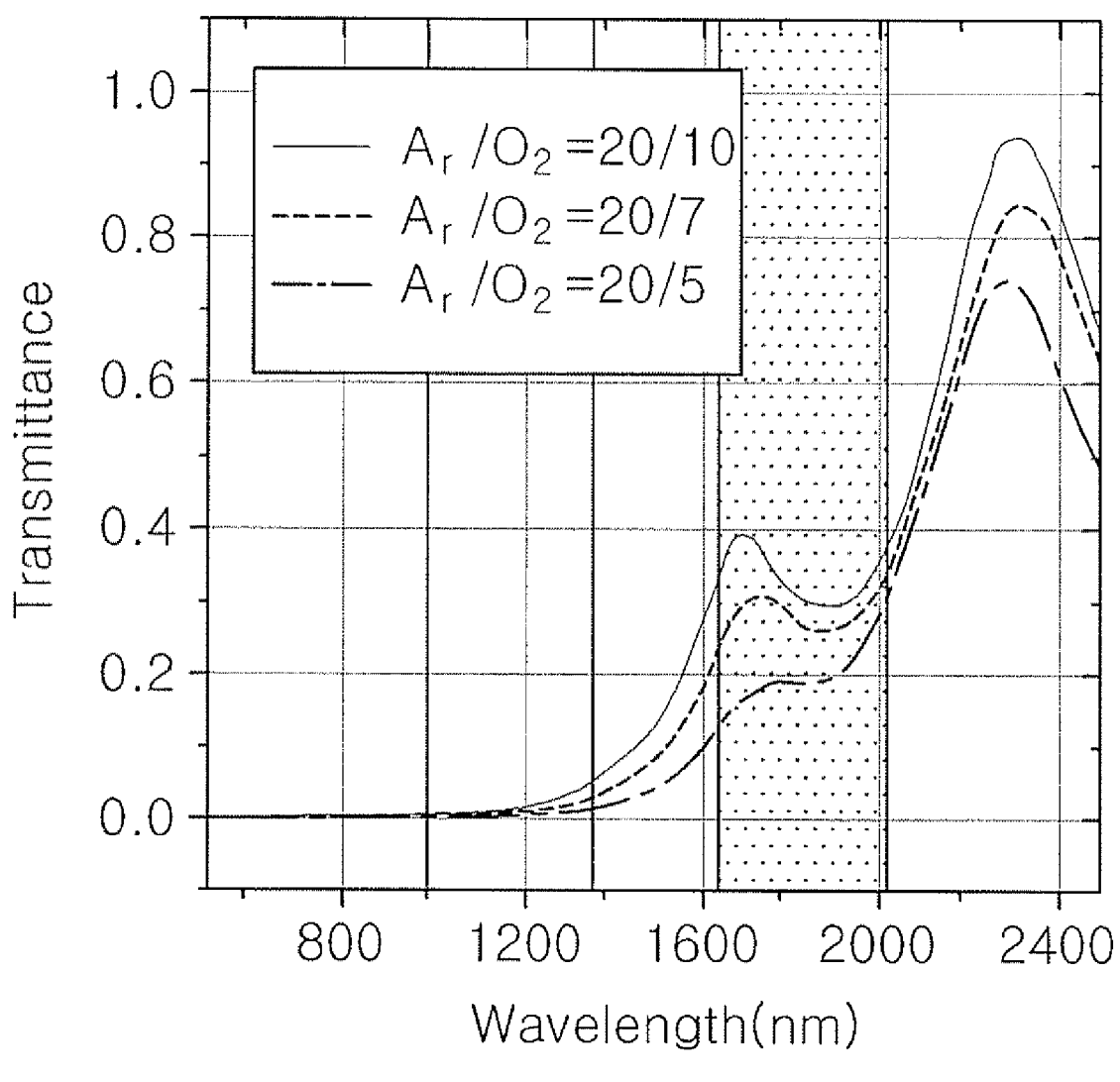
FIG. 5 is a diagram illustrating movement of light transmittance curves after an oxygen-doped chalcogenide material is annealed and illustrates the light transmittance curves of chalcogenide material varying according to the amount of injected oxygen.

FIG. 5 is a graph illustrating a result of measuring, at light transmittance curve, band gaps varying after annealing the chalcogenide material manufactured using different injection proportions of the amount of oxygen gas/argon gas as shown in FIG. 4. FIG. 5 shows cases when the injection proportions of the amount of oxygen gas/argon gas are 0.25, 0.35 and 0.5, respectively.

If the annealing is performed, samples are changed from amorphous to crystalline. When the injection proportion of the amount of oxygen gas/argon gas is 0.1, the band gap has a weak wavelength of 1700 nm band, and when the injection proportions of the amount of oxygen gas/argon gas are 0.25, 0.35 and 0.5, all band gap bands moves to have a wavelength of 1700 nm band.

Finally, if the oxy-doped chalcogenide thin film is annealed, its phase change is made from amorphous to crystalline to decrease the band gap. This result is the same as the feature that a band gap is changed from 0.7 eV to 0.5 eV according to a phase change from amorphous to crystalline shown by a general chalcogenide material not doped with oxygen.

However, in the case of the oxy-doped chalcogenide thin film, there is no difference in that the band gap moves from initial amorphous of 1.0 eV to 1.2 eV to about 0.7 eV according to a phase change into crystalline, when the injection proportion of the amount of oxygen gas/argon gas is 0.1 to 0.5.

Hereinafter, a method to manufacture the P-type chalcogenide material will be described.

As shown in FIG. 3, in order to manufacture the P-type chalcogenide material, one or more Te alloy of GeTe, SbTe, and Te is deposited on the oxy-injected chalcogenide thin film (material) and is annealed to be diffused.

It has been described above that the reason why the chalcogenide material shows the P-type conductivity is the vacancy state. Therefore, if a Te chalcogen element, which is the main factor to generate the vacancy state, is injected, there is high possibility that the chalcogenide material will be changed to the material having the P-type conductivity.

Therefore, in the embodiment of the present invention, the oxy-injected chalcogenide material is changed from the material having the N-type conductivity to the material having the P-type conductivity using a method of injecting GeTe. The injection method is performed by depositing GeTe on the deposited and oxy-doped chalcogenide material and then performing annealing thereon to be diffused. The annealing is performed at the annealing temperature to be diffused, that is, at a temperature that the phase of chalcogenide is changed from amorphous to crystalline for about an hour.

Table 2 shows that depending on the thickness of GeTe deposited on the oxy-doped N-type chalcogenide material, the N-type chalcogenide material is changed into the P-type chalcognide material. Herein, GSTO represents the N-type chalcogenide material having the injection proportion of the amount of oxygen gas/argon gas of 0.1.

TABLE 2

| Structure | Type | Carrier Concentration (/cm$^2$) |
|---|---|---|
| GeTe/GSTO = 0.1 | N type | −1.49e15 |
| GeTe/GSTO = 0.2 | N type | −3.7e14 |
| GeTe/GSTO = 0.3 | P type | +2.3e16 |

Figure 6:
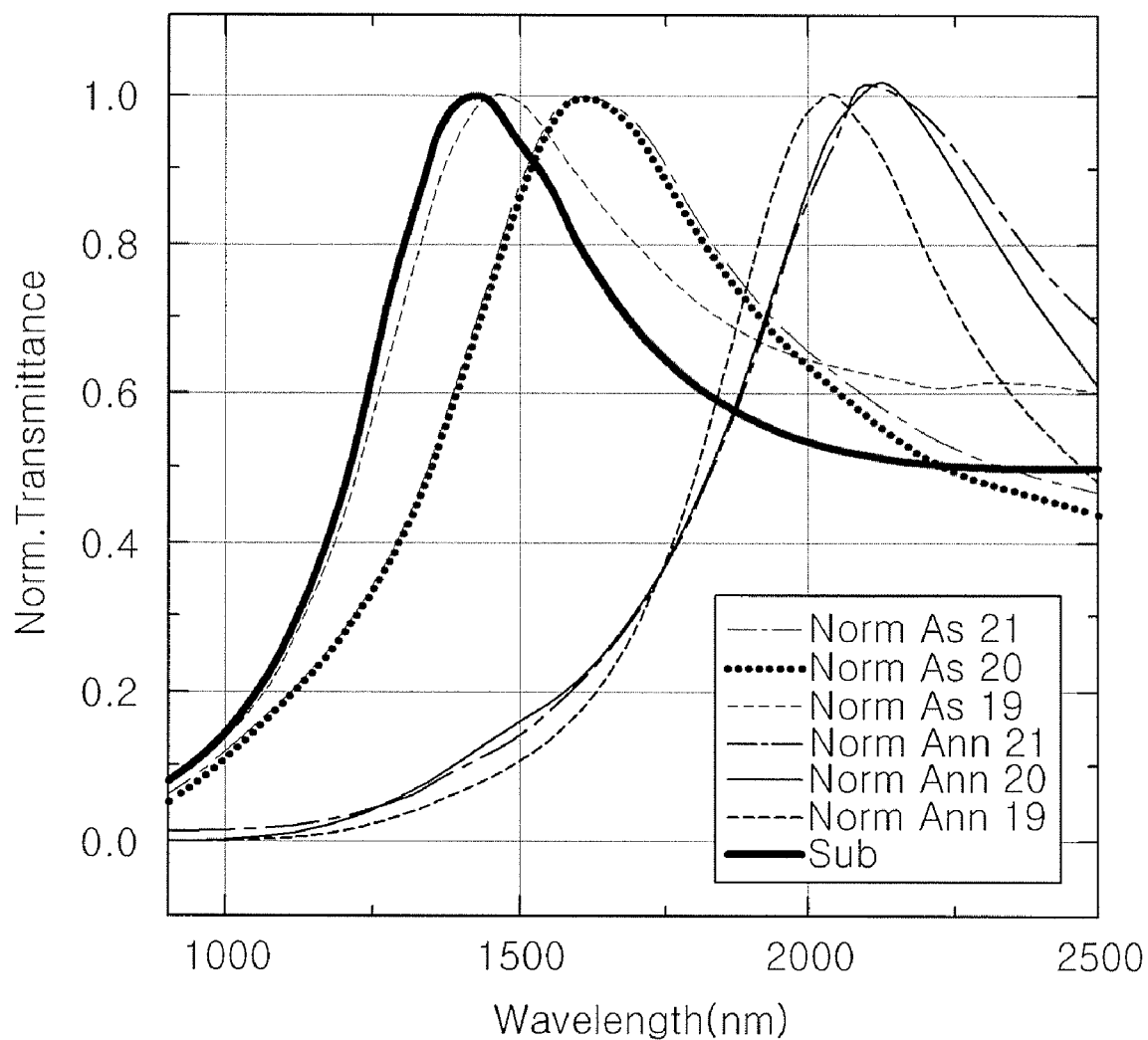
FIG. 6 is a diagram illustrating light transmittance curves before P-type chalcogenide material is diffused and annealed.

FIG. 6 shows another light transmittance curves before the P-type chalcogenide material manufactured according to Table 2 is diffused and annealed. These are light transmittance curves before the light transmittance curves between 1000 and 1500 nm at the left side, are diffused. Norm AS21, Norm AS20, and Norm AS19 in FIG. 6 represent light transmittance of oxy-added N-type semiconductor before being annealed, and Norm Ann21, Norm Ann20, and Norm Ann19 in FIG. 6 represent light transmittance of oxy-added N-type semiconductor after being annealed.

Figure 7:
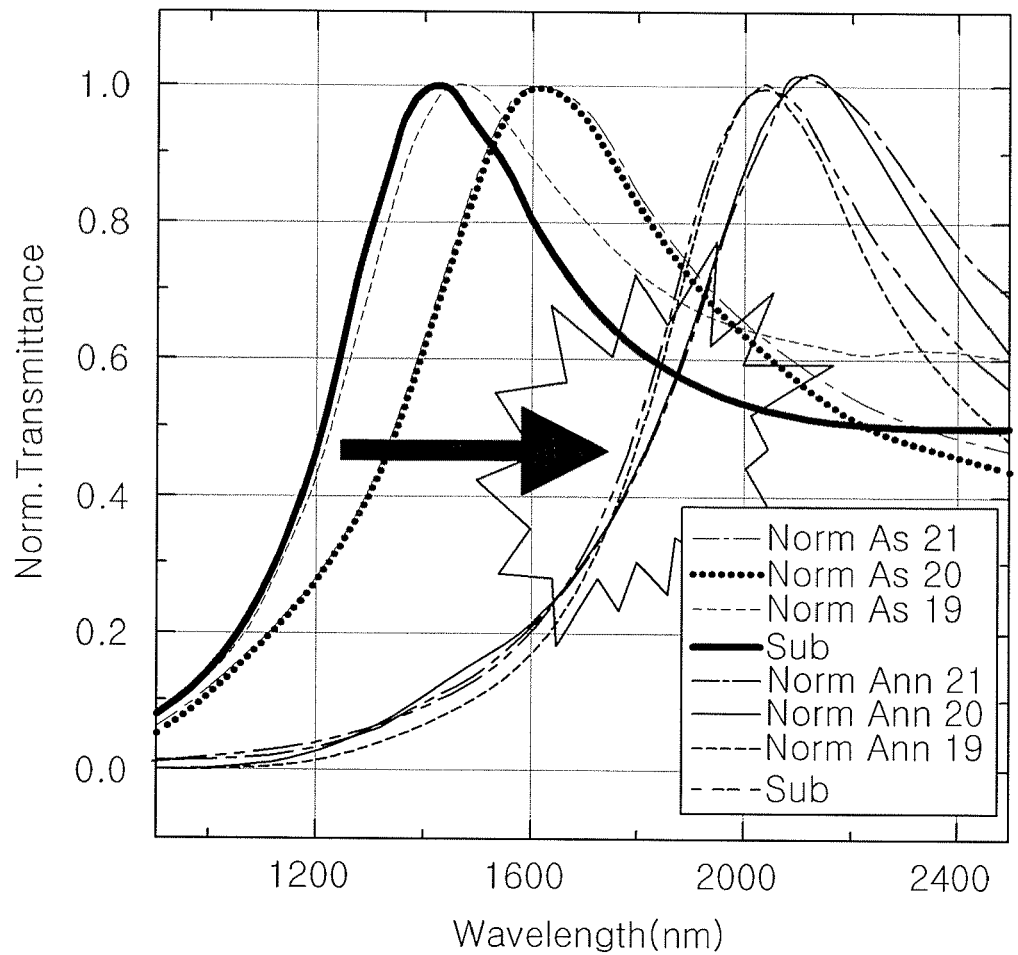
FIG. 7 is a diagram illustrating light transmittance curves after P-type chalcogenide material is diffused and annealed.

FIG. 7 shows light transmittance curves after P-type chalcogenide material manufactured according to Table 2 is diffused and annealed (right curves moving to 1700 nm).

It can be appreciated that the light transmittance curves of the P-type chalcogenide material diffusing GeTe are doped to the extent that they are not greatly changed in the light transmittance curves of the early oxy-doped N-type chalcogenide material.

In the above, the methods to manufacture the N-type chalcogenide material and the P-type chalcogenide material have been described. Hereinafter, a method of fabricating a chalcogenide transistor using the chalcogenide material having the N-type conductivity and the chalcogenide material having the P-type conductivity manufactured through the above-described process will be described in detail.

FIGS. 8 to 18 are diagrams for illustrating a process sequence to fabricate a transistor device having an improved on/off proportion using the N-type chalcogenide material and the P-type chalcogenide material.

Figure 8:
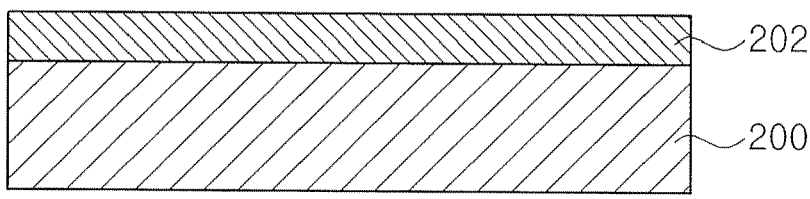
FIGS. 8 to 18 are diagrams illustrating a process to fabricate a transistor having an improved on/off proportion using an N-type chalcogenide material and a P-type chalcogenide material.

More specifically, a metal layer 202 for gate electrode is formed on a substrate 200, for example, a glass substrate (FIG. 8). The metal layer 202 for gate electrode 202 is formed on the substrate 200 using a sputtering method. The metal layer for gate electrode 202, for example, is formed of a gold layer, an aluminum layer or a chrome layer. The metal layer for gate electrode 202 is patterned using a photolithography process to form a gate electrode 204. Therefore, the gate electrode 204 having a lower gate shape is completed (FIG.

9). The gate electrode 204 serves to turn on/off optical current flowing on a chalcogenide layer 208 to be described later.

Figure 9:
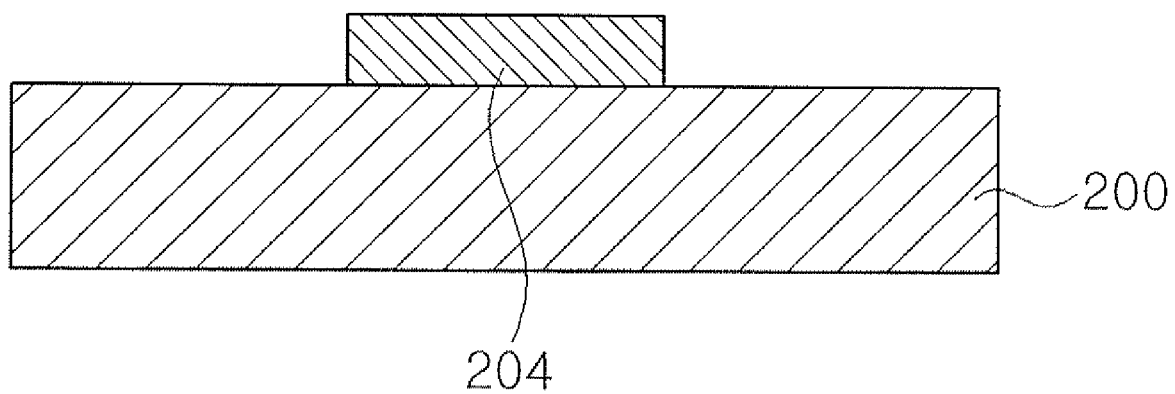

Meanwhile, in FIG. 9, a gate dielectric 206 and the gate electrode 204 are constituted in a lower gate shape formed in a lower part of the chalcogenide layer 208, however, the gate dielectric 206 and the gate electrode 204 may be constituted by an upper gate shape formed in the upper part of the chalcogenide layer 208.

Figure 10:
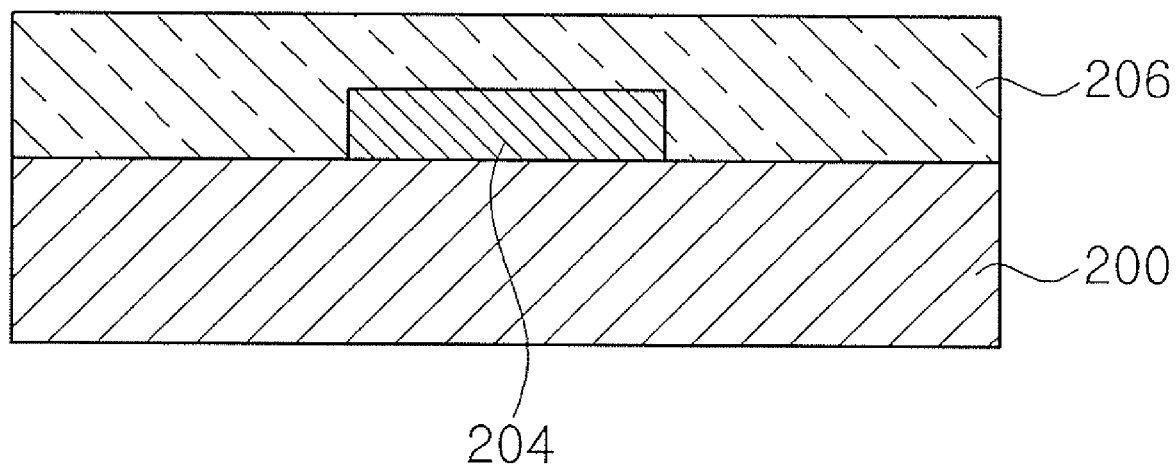

The gate oxide 206 is formed on the gate electrode 204 and the substrate 200 (FIG. 10). The gate dielectric 206 may be formed of chalcogonide oxide, for example, an $As_2S_3$ layer, or organic material such as a polymer PMMA film, a silicon oxide film, a silicon insulating film or the like. The polymer poly methyl methacrylate (PMMA) layer, which is organic material constituting the gate dielectric 206, is made of a transparent layer material. The gate dielectric 206 maintains a good contact with a chalcogenide layer 208 and serves not to change the characteristics of the chalcogenide layer 208 during the manufacturing process.

When using the silicon oxide film, the gate dielectric 206 is formed by using a plasma enhanced chemical vapor deposition (PECVD) method.

Figure 11:
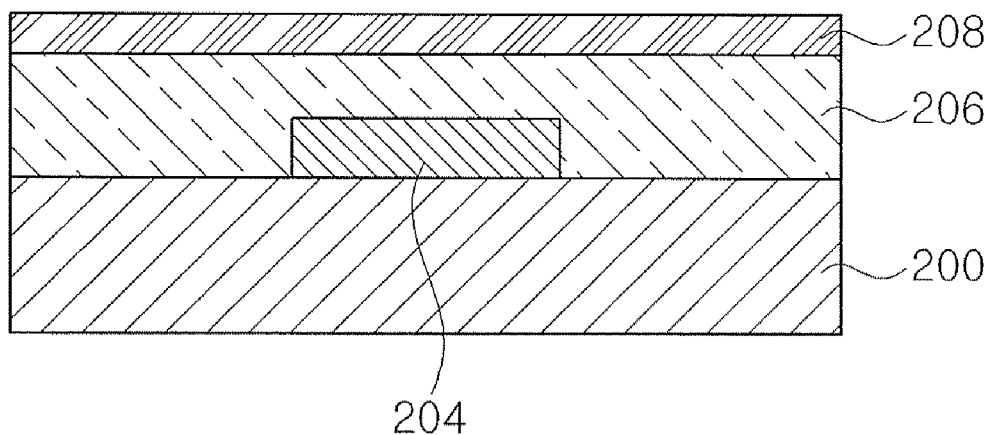

Next, the amorphous chalcogenide layer 208 is deposited on the gate dielectric 206. At this time, as described above with reference to FIG. 3, the argon gas and the oxygen gas are injected simultaneously into the deposition device in order to form an amorphous N-type chalcogenide layer 208. Then, some of the injected oxygen gas is injected into the deposited chalcogenide material, and, the N-type chalcogenide layer 208 is formed by means of the oxygen injected at this time. In the embodiment of the present invention, the chalcogenide layer 208 is formed as a GST layer using a sputtering method (FIG. 11).

Figure 12:
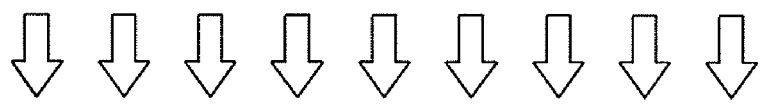
Figure 12:
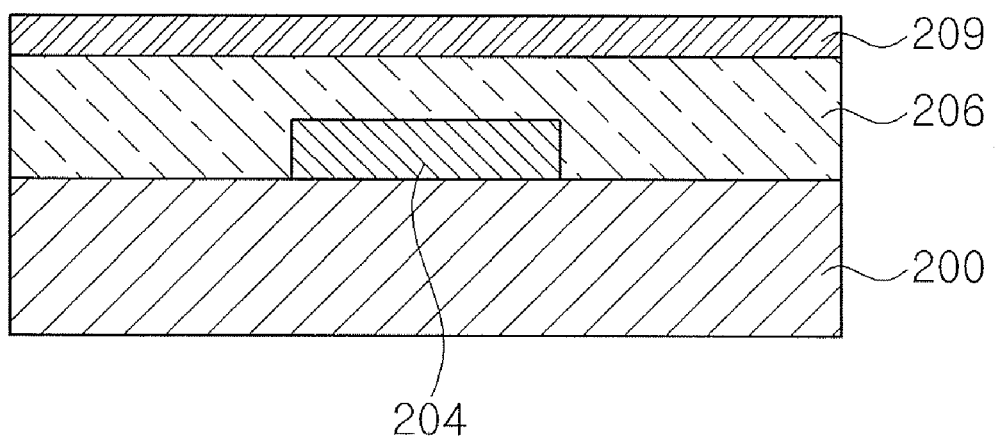

Then, the laser light is emitted onto an upper surface of the amorphous chalcogenide layer 208 to form a crystalline chalcogenide layer 209 (FIG. 12).

Figure 13:
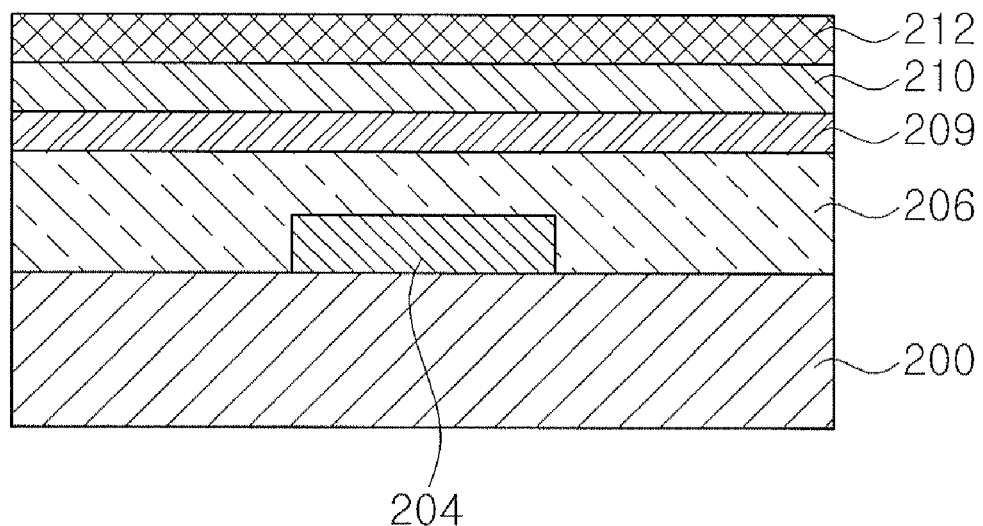

A diffusion prevention layer 210 is deposited on the chalcogenide layer 209 in order to prevent the diffusion. At this time, the diffusion prevention layer 210 is formed of a silicon oxide film $SiO_2$ or the like. Thus, a metal layer 212 is formed on the diffusion prevention layer 210. For example, the metal layer 212 is formed using aluminum (Al) (FIG. 13).

Figure 14:
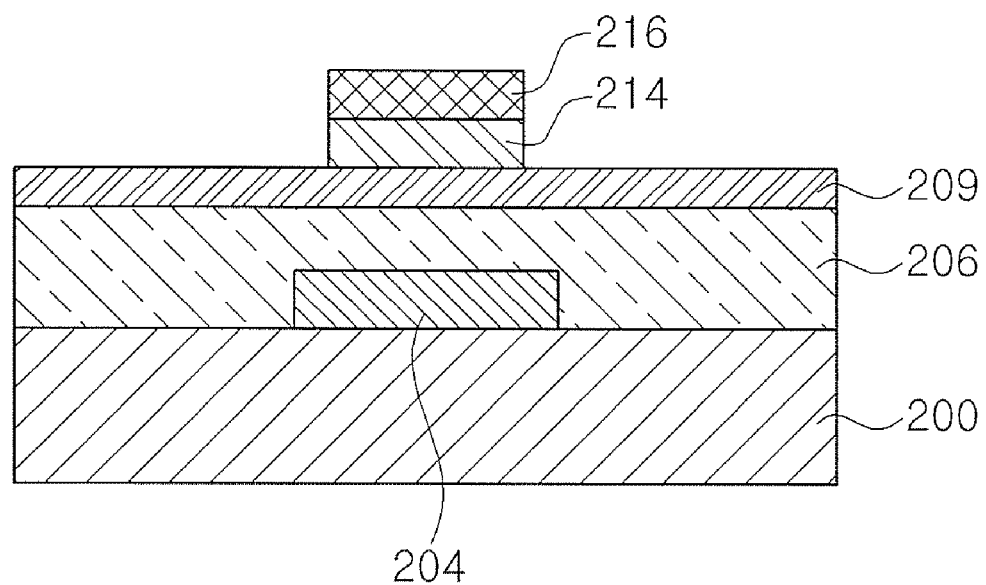

Next, the diffusion prevention layer 210 and the metal layer 212 formed on the crystalline chalcogenide layer 209 are patterned using a photolithography process and a wet-etching process to form a diffusion prevention layer 214 and a metal layer 216 having a predetermined width (FIG. 14).

The oxy-injected chalcogenide layer 209 is changed to have N-type conductivity material to P-type conductivity material using a method of depositing GeTe on the chalcogenide layer 209 and the metal layer 216 formed on the gate dielectric 206 and performing annealing thereon to be diffused. The annealing temperature to be diffused is annealed at a temperature that the phase of chalcogenide is changed from amorphous to crystalline for about an hour.

As described above, a GeTe thin film is diffused from both sides of the chalcogenide film 209 on which the diffusion prevention layer 214 is not formed through the annealing process. In other words, the GeTe thin film deposited on the exposed chalcogenide layer 209 is diffused from the both sides of the chalcogenide layer 209 having N-type conductivity through the annealing process. Therefore, the both sides of the chalcogenide layer 209 having N-type conductivity is changed into a chalcogenide layer 220 having P-type conductivity.

Figure 15:
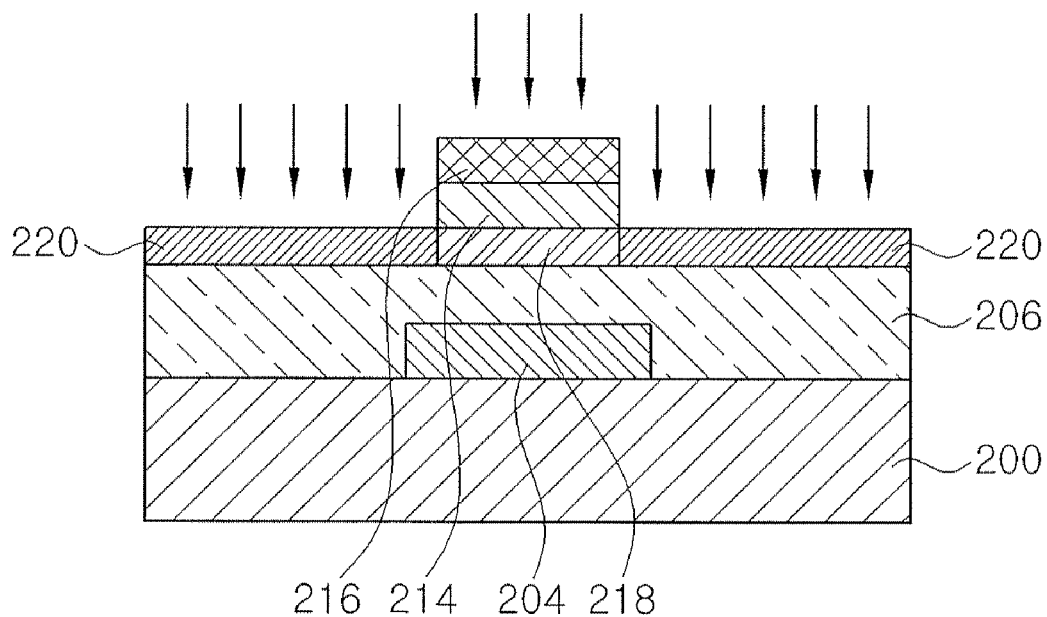

At this time, the chalcogenide layer 209 on which the diffusion prevention layer 214 is formed, that is, the non-exposed chalcogenide layer 209, maintains a state of the chalcogenide layer 218 having N-type conductivity, as it is. In the present invention, a process where a channel of transistor is naturally formed as described above, will be referred to as a 'self-aligned channel process' (FIG. 15).

Therefore, the width and length of a channel is naturally formed according to the shape of an oxidation prevention layer 214 patterned on the N-type chalcogenide layer 209. The GeTe deposited on the diffusion prevention layer 214 will be removed in the following process.

Figure 16:
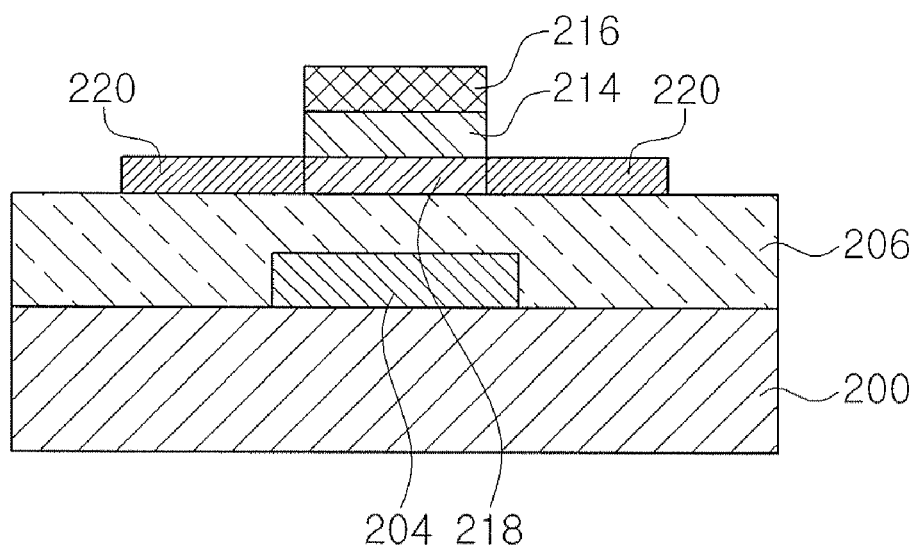
Figure 17:
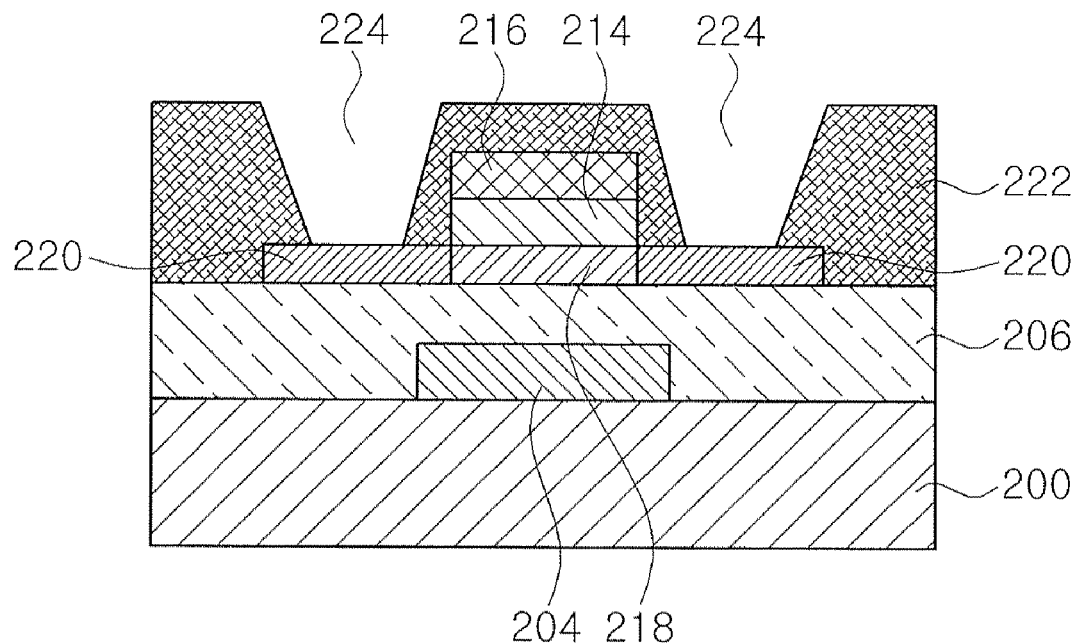

Thereafter, the chalcogenide layer 220 having P-type conductivity is patterned to have a predetermined width (FIG. 16). Layers 222 are formed on the chalcogenide layer 220, the metal layer 216, and the gate oxide 206 to allow contact holes 224 to be formed (FIG. 17).

Figure 18:
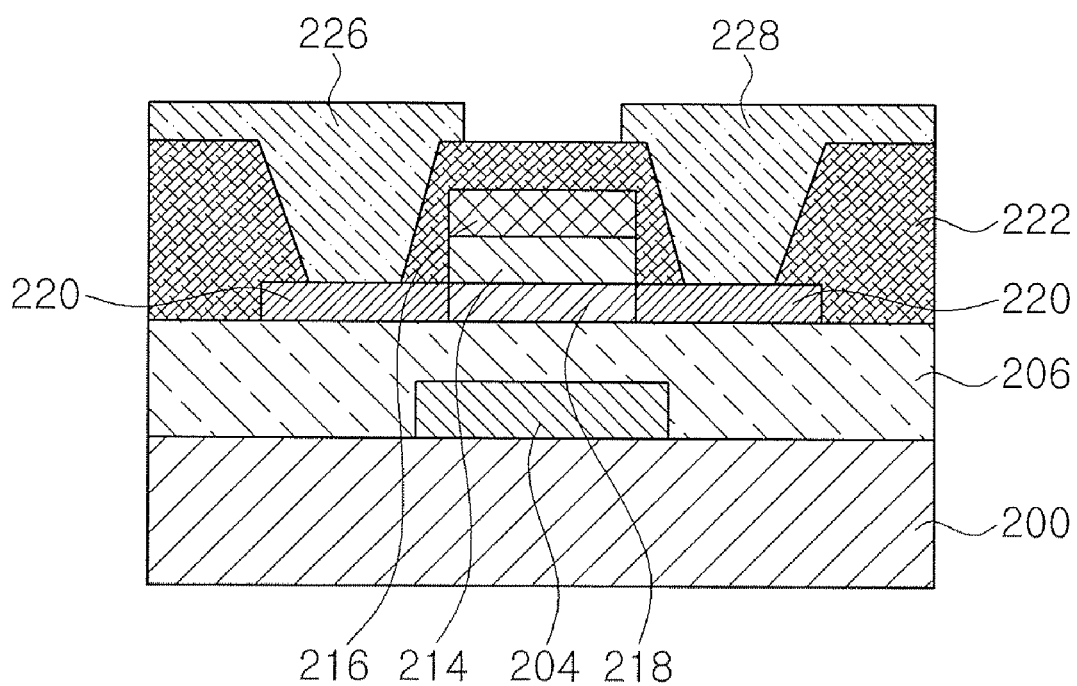

Next, a source-side metal electrode 226 and a drain-side metal electrode 228 are formed on the contact holes 224, thereby completing a thin film transistor (FIG. 18).

Figure 19:
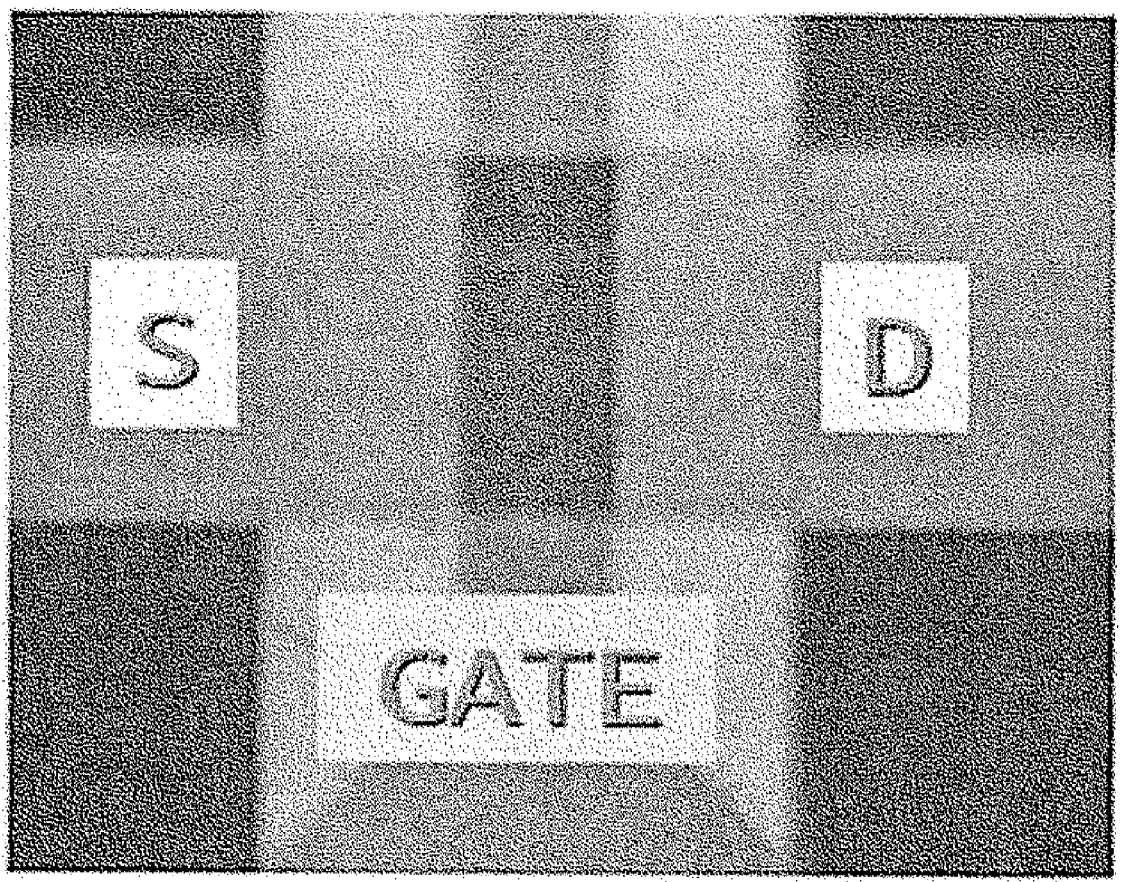
FIG. 19 illustrates a channel shape of transistor that is naturally formed using a doped homojunction chalcogenide thin film transistor according to the present invention.

FIG. 19 shows a shape of a device manufactured according to the process sequence shown in FIGS. 8 to 17. In other words, FIG. 19 shows a shape right before source-side and drain-side metal electrodes are formed. A portion in the central portion, indicated in black, corresponds to a channel of transistor. The thin film transistor according to the present invention has an advantage that a width of channel is naturally aligned through a self-aligned channel process as mentioned with reference to FIG. 15.

Figure 20:
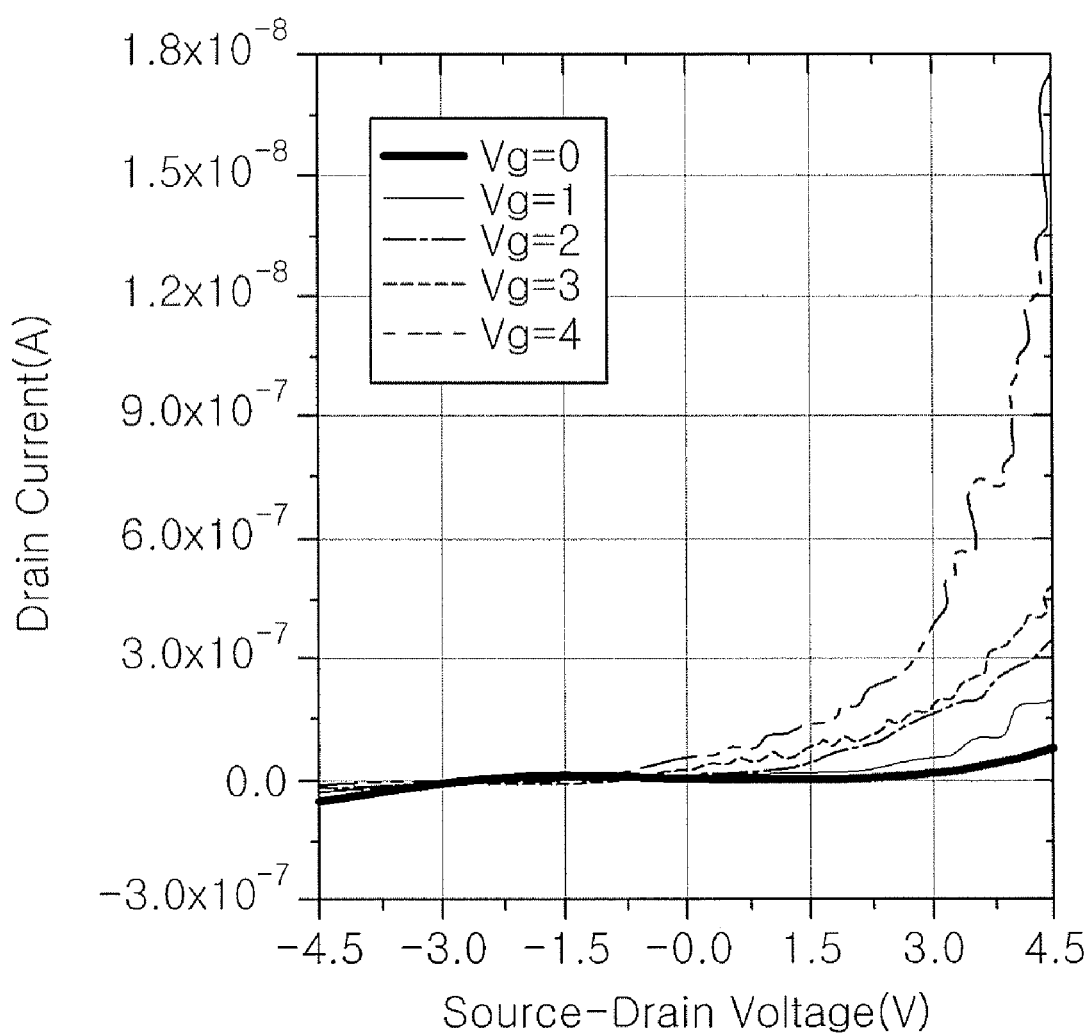
FIG. 20 is a graph illustrating properties of a doped homojunction chalcogenide thin film transistor fabricated using the N-type chalcogenide and the P-type chalcogenide manufactured using the manufacturing method of the present invention.

FIG. 20 is a graph illustrating properties of a doped homojunction chalcogenide thin film transistor fabricated using the N-type chalcogenide and P-type chalcogenide manufactured through the process as described above.

An axis X represents source-drain voltage, and an axis Y represents ampere drain current. The characteristic curves of the transistor, which operates very clearly at a relatively small gate voltage, can be confirmed. Also, very excellent characteristics of current rectification can be confirmed.

Although the preferred embodiment of the present invention is described, it will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A thin film transistor, comprising:
    an oxygen and GeTe doped chalcogenide layer forming a channel layer and constituting a first type conductivity;
    an oxygen doped chalcogenide layer formed at both sides of the chalcogenide layer having the first type conductivity to constitute source and drain regions and having a second type conductivity; and
    source and drain electrodes connected to the chalcogenide layer constituting the source and drain regions and having the second conductivity.

2. The thin film transistor according to claim 1, wherein the chalcogenide layer constituting the channel layer and the source and drain regions is a $Ge_2Sb_2Te_5$ layer.

3. The thin film transistor according to claim 1, further comprising:
    a gate electrode formed by interposing a gate dielectric at the bottom of the chalcogenide layer having the first conductivity.

4. The thin film transistor according to claim 3, wherein the gate dielectric is a polymer PMMA film that is an organic material.

5. The thin film transistor according to claim 3, wherein the gate dielectric is a silicon oxide film formed using a PECVD method.

6. The thin film transistor according to claim 1, wherein a diffusion prevention layer is formed on the upper part of the chalcogenide layer having the first conductivity.

7. The thin film transistor according to claim 1, wherein the channel layer is P-type, and the source and drain regions are N-type.

8. A thin film transistor comprising:
   an oxygen doped chalcogenide layer forming a channel layer and constituting a first type conductivity;
   an oxygen and GeTe doped chalcogenide layer formed at both sides of the oxygen doped chalcogenide layer having the first type conductivity to constitute source and drain regions and having a second type conductivity; and
   source and drain regions and having the second type conductivity.

9. The thin film transistor according to claim 8, wherein the chalcogenide layer constituting the channel layer and the source and drain regions is a $Ge_2Sb_2Te_5$ layer.

10. The thin film transistor according to claim 8, further comprising:
    a gate electrode formed by interposing a gate dielectric at the bottom of the oxygen doped chalcogenide layer having the first type conductivity.

11. The thin film transistor according to claim 10, wherein the gate dielectric is a polymer PMMA film that is an organic material.

12. The thin film transistor according to claim 10, wherein the gate dielectric is a silicon oxide film formed using a PECVD method.

13. The thin film transistor according to claim 8, wherein a diffusion prevention layer is formed on the upper part of the oxygen doped chalcogenide layer having the first type conductivity.

\* \* \* \* \*